United States Patent [19]
Sonoda

[11] 3,969,708
[45] July 13, 1976

[54] STATIC FOUR DEVICE MEMORY CELL

[75] Inventor: George Sonoda, Poughkeepsie, N.Y.

[73] Assignee: International Business Machines Corporation, Armonk, N.Y.

[22] Filed: June 30, 1975

[21] Appl. No.: 592,148

[52] U.S. Cl. .......................... 340/173 FF; 307/238; 340/173 R
[51] Int. Cl.² ..................... G11C 7/00; G11C 11/40
[58] Field of Search.... 340/173 CA, 173 R, 173 FF; 307/238, 279, 291

[56] References Cited
UNITED STATES PATENTS

| | | | |
|---|---|---|---|
| 3,688,280 | 8/1972 | Ayling et al. | 340/173 FF |
| 3,900,838 | 8/1975 | Wiedmann | 340/173 FF |

OTHER PUBLICATIONS

Wiedmann: Memory Cell with Low Standby Power, IBM Tech. Discl. Bull. No. 6, vol. 14, Nov. 1971, p. 1720.

*Primary Examiner*—Thomas A. Robinson
*Attorney, Agent, or Firm*—Theodore E. Galanthay

[57] ABSTRACT

Disclosed is a field effect transistor (FET) memory array in which each of the cells forming the array comprises four FET's. The first and second of the four FET devices are cross-coupled while the third and fourth FET devices form loads for the cross-coupled pair. The load devices are never fully turned off so that complete D.C. stability is achieved with a four device cell because no one cell in an array of memory cells ever goes into a data retention mode.

7 Claims, 3 Drawing Figures

3,969,708

STATIC FOUR DEVICE MEMORY CELL

CROSS REFERENCES TO RELATED APPLICATIONS AND PATENTS

1. Spampinato et al U.S. Pat. No. 3,541,530, issued on Nov. 17, 1970 and assigned to the assignee of the present invention.
2. Sonoda U.S. application Ser. No. 535,464 filed on Dec. 23, 1974, and assigned to the assignee of the present invention.

BACKGROUND OF THE INVENTION

1. Field of the Invention

This invention relates to a semiconductor memory array and more particularly to such an array in which each memory cell comprises four field effect transistors, wherein none of the cells ever goes into a data retention mode.

DESCRIPTION OF THE PRIOR ART

The above mentioned Spampinato et al patent exemplifies the prior art in memory arrays having memory cells comprising four field effect transistors. Such four device cells have traditionally not been D.C. stable and therefore require periodic refreshing to prevent the loss of the stored information. A number of different techniques for refreshing such non-D.C. stable memory cells were developed, however, they lacked the advantageous feature of D.C. stability.

A D.C. stable semiconductor memory array was finally developed by the inventor of the present application as described in the cross referenced Sonoda patent application. The D.C. stable memory cell therein described was a significant advance over the prior art in that a D.C. stable memory array could be fabricated from memory cells having only four devices. As was noted in that application, however, during certain times certain ones of the memory cells were completely turned off, at which time such memory cells would go into a data retention mode. If a cell were turned off for a period greater than the data retention time of the cell, the data would be lost.

SUMMARY OF THE INVENTION

Accordingly, it is a primary object of this invention to provide a memory array of four device memory cells in which none of the cells ever go into a data retention mode.

It is another object of this invention to provide a four device memory cell which is unaffected by bit line leakage.

It is a still further object of this invention to provide a static four device memory cell requiring only two potential levels applied to the word line, for operation.

In accordance with the present invention, a semiconductor memory array of four device FET cells is provided. Word lines and bit lines are arranged orthogonally in a known manner to permit accessing and sensing of information with an individual desired memory cell. A pair of common bit line load devices is provided to maintain each pair of bit lines at the same logic level. In accordance with the present invention, a capacitor is connected to each bit line providing a pair of sense nodes adapted for sensing the state of a selected memory cell in the A.C. mode. By sensing the condition of a selected cell in the A.C. mode, a memory cell does not have to provide a full logic level in order to provide a detectable transient on a desired bit line. Thus, bit lines need not be pre-charged and neither bit line is brought to a full logic down level providing a desired reduction in power consumption.

In the foregoing mode of operation, insignificant capacitive coupling into the silicon substrate results, since during a read or write operation, the bit line transition is minor and unselected word lines are static. Also, greater tolerance to bit line leakage current is provided when small sense signals are adequate. Furthermore, since the bit lines are not brought to a full logic down level, there is potentially less sensitivity of internal storage cell nodes to surface leakage.

A particularly desirable embodiment of the present invention utilizes depletion mode load devices so that the logic down level applied to an unselected word line can be 0 volts.

The foregoing and other objects, features, and advantages of this invention will be apparent from the following more detailed description of a preferred embodiment of the invention as illustrated in the accompanying drawings.

DETAILED DESCRIPTION

Figure 1:
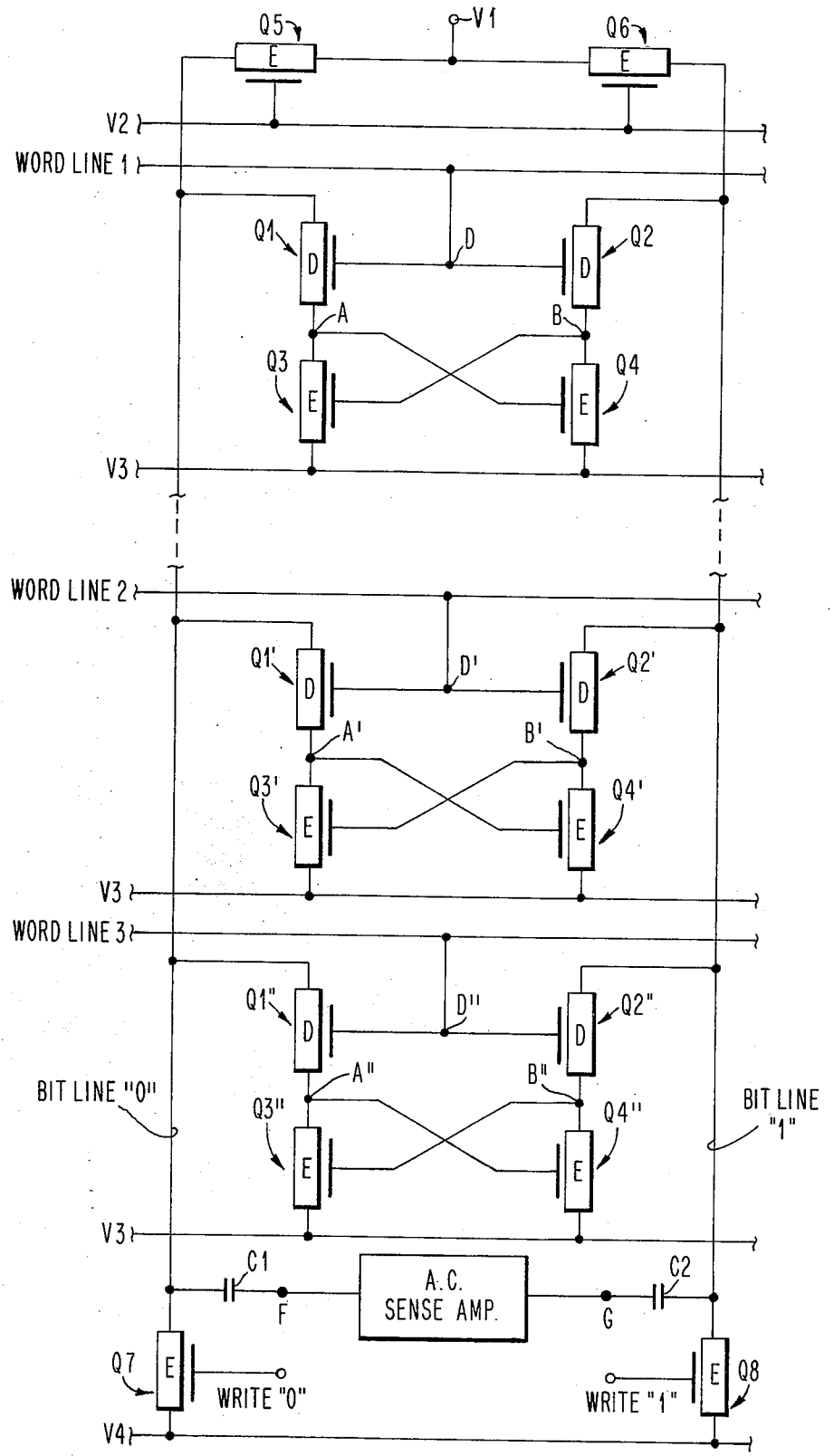
FIG. 1 is a schematic circuit diagram of a column of memory cells in accordance with the present invention.

Refer now to FIG. 1 for description of the circuit details. A column of three cells is shown for purposes of illustration. A typical cell includes four field effect transistors such as Q1, Q2, Q3, and Q4. The additional cells have been labeled with the same numbers but with prime and double prime notation. Each of the field effect transistors have two gated electrodes and a gating electrode. Transistors Q3 and Q4 have a gated and gating electrode of one, respectively connected to a gating and gated electrode of the other, forming a cross-coupled pair; the other of the gated electrodes of each of said transistors being connected to a fixed potential V3. In the present description, n channel devices will be assumed and V3 will be set at ground potential of 0 volts. Devices Q1 and Q2 are load devices, each connected between the internal cell nodes A and B and the associated bit line "0" and bit line "1", respectively. Those skilled in the art will recognize that, in practice, numerous such cells compose an array and the number illustrated here has been limited merely for ease of illustration.

Each column of cells has a pair of common bit line load devices Q5 and Q6. A common connection connects one of the gated electrodes of each of the common bit line load devices to each other and to a potential V1 which in the present example is typically in the range of 5 volts to 8.5 volts. The other gated electrode of each of the common bit line load devices is connected to its respective bit line "0" or bit line "1". The gating electrode of each of devices Q5 and Q6 is connected to a potential V2 which in the present example is approximately 8.5 volts.

In order to write information into any one of the illustrated memory cells, gating transistors Q7 and Q8 are provided. Q7 has its gated electrodes connected in a series path from bit line "0" to potential V4, while its gating electrode is connected to the write "0" node. Gating transistor Q8 has its gated electrodes connected in a series electrical path between bit line "1" and the potential of V4 while its gating electrode is connected to the write "1" node. For the purposes of the present example, V4 is maintained at approximately 2 volts. With respect to the foregoing description, it is noted that all transistors are of the enhancement type except for load devices Q1 and Q2 (and the corresponding load devices indicated with prime and double prime notation) which are depletion mode devices. By utilizing depletion mode devices, the word lines may be brought to a full down potential without turning off the depletion load devices and without adversely affecting the static nature of the disclosed four device cell.

In order to sense the information in any given cell during a read cycle, an A.C. sense amplifier is provided for each column of cells. By A.C. sense amplifier is meant a differential amplifier capable of detecting transient variations as opposed to steady state levels. The A.C. sense amplifier is coupled to sense nodes F and G as illustrated. Sense node F is coupled to bit line "0" by means of capacitor C1 while sense node G is coupled to bit line "1" by means of capacitor C2. Thus, during the read cycle, small variations in the potential of the bit lines can be sensed and detected as binary information stored in the various memory cells.

Figure 2:
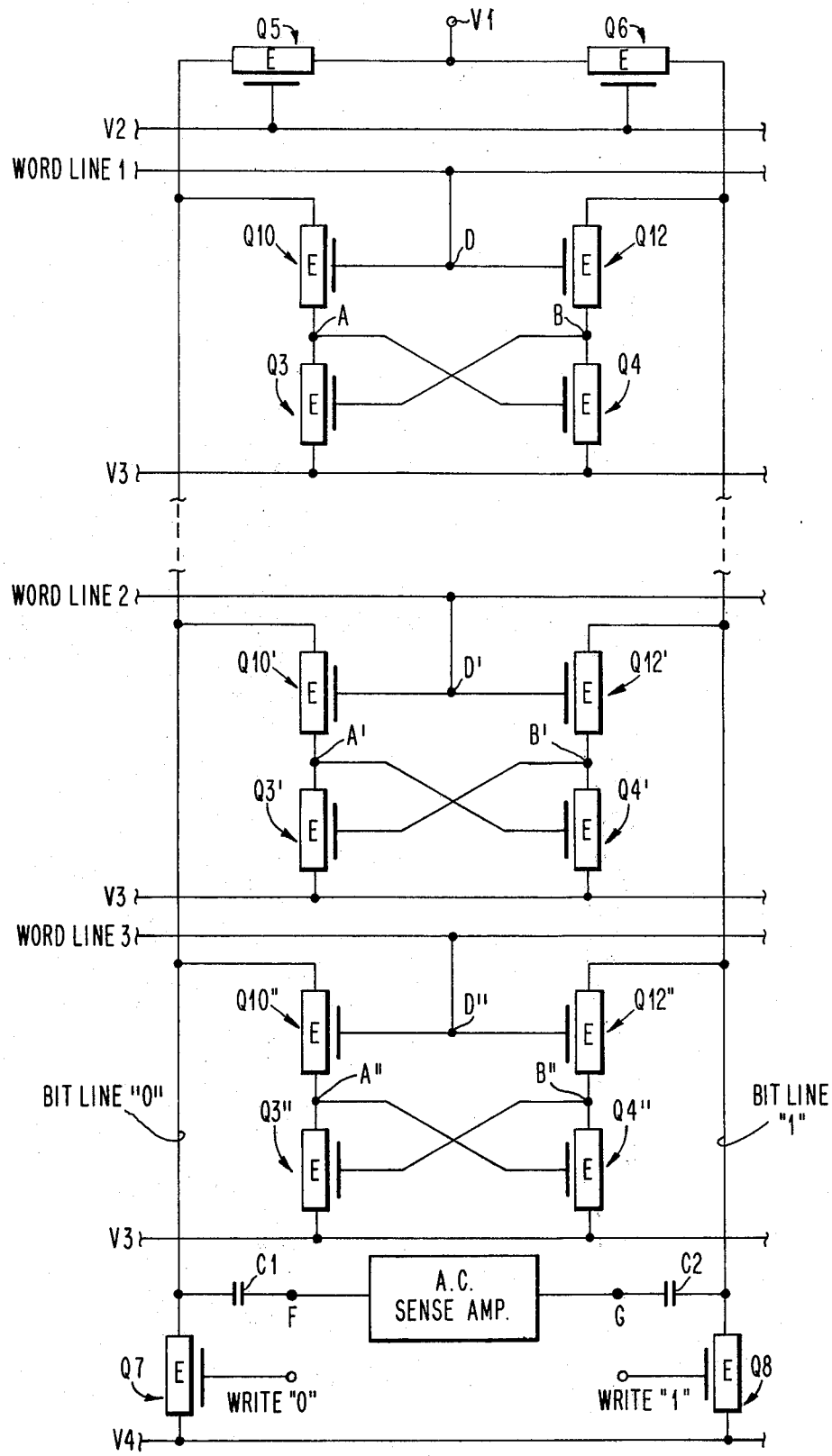
FIG. 2 is a schematic circuit diagram of a column of memory cells in accordance with the present invention.

The FIG. 2 embodiment, as illustrated, is substantially similar to FIG. 1. A noted difference is that load devices Q10 and Q12 (as well as their counterparts indicated with prime and double prime notation) are enhancement mode as all the other transistors in the array. This simplifies the semiconductor processes required for fabrication, but requires that the potential V3 not be brought to ground potential. In order to maintain the static nature of the disclosed memory array, in the FIG. 2 embodiment the down level of V3 must be some potential intermediate 0 volts and 8.5 volts, such as 2.5 volts.

The width to length W/L ratio of the load devices can be varied over a considerable range, depending on the trade-off between desired sense current, the allowable power dissipation, and the storage cell area. The ratio of W/L of load devices to W/L of the cross-coupled devices has to be small enough to maintain cell stability, yet large enough to enable a write operation by unbalancing the currents through the load devices. One possible design would have a load device W/L ratio of 1/10 and a cross-coupled device W/L ratio of 1/1. As was previously pointed out, the potential levels etc., specified herein assume n channel field effect transistors with a threshold voltage of approximately 0.7 volts.

Figure 3:
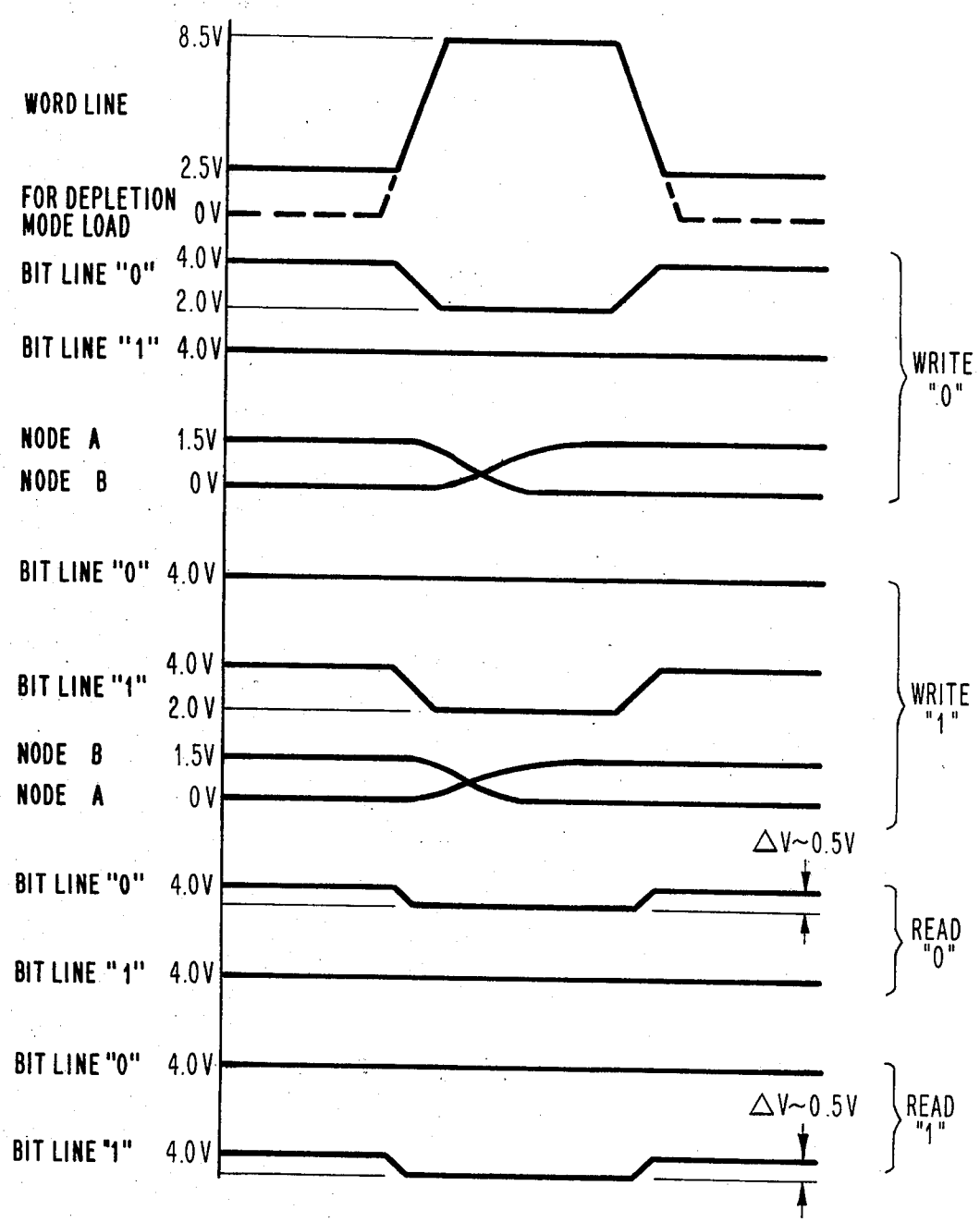
FIG. 3 is a series of waveform diagrams depicting the operation of the circuits of FIGS. 1 and 2.

With continued reference to FIGS. 1 and 2, refer also to FIG. 3 for a description of the operation of the present invention. Consider first the case of FIG. 2 in which all the devices are enhancement mode. Also, consider first the standby state. This is the condition when none of the cells in the illustrated column are to be selected. In this state, the gating electrodes (nodes D, D', and D'') of the load devices are connected to a potential of 2.5 volts in the FIG. 2 embodiment. This 2.5 volt potential can be generated on-chip from other available supplies, since there is no current drain. The bit lines are biased at above 4 volts through common bit line load devices Q5 and Q6. The actual voltage of the bit lines will be a function of supply potentials V1 and V2, the impedance of devices Q5 and Q6, as well as the state of all the storage cells along a bit line pair.

For example, if it is assumed that 32 cells share common load devices Q5 and Q6, it can be seen that the highest bit line bias occurs when all 32 storage cells are in a state which causes no load current (except leakage current) being supplied through the bit line and the associated common load device. Minimum bit line bias occurs when all 32 storage cells are in a state which causes 32 load currents to be supplied through the bit line and the associated common load device. Thus, depending on the number of storage cells along a pair of bit lines with "0" and "1" logic states, the bit line bias will remain between the above described minimum and maximum potentials.

With quiescent voltages on the bit line, as described, and the gate voltage of the load devices set at about 2.5 volts (for the FIG. 2 embodiment) the storage cells will maintain information indefinitely. For a "0" logic state, node A (or node A' or node A'') remains at less than the threshold voltage of device Q4 (less than 0.2 volts) keeping it "off". Node B (or node B' or node B'') will remain at about 1.3 volts, maintaining device Q3 "on" with node A at less than 0.2 volts. For a logical "1", device Q3 is "off" and Q4 is "on".

Consider next the write operation. Writing is accomplished by disturbing the stored cell to be written by raising the gate voltage of the load devices to an up logic level such as 8.5 volts, while one bit line is held to a down level of approximately 2 volts. This is illustrated in the waveform diagrams of FIG. 3. If a "0" is to be written, the word line is raised to 8.5 volts, and the bit line "0" is dropped to 2 volts through gating device Q7. Assume for the present example that word line one (1) is the selected word line. Simultaneously, bit line "1" is maintained at approximately 4.0 volts turning Q12 on harder. Current through the load device Q12 is increased about ten times that of the standby current and raises node B above the threshold voltage of device Q3. Current starts to flow through device Q3, lowering the voltage of node A and further raising the impedance of device Q4. Accordingly, through regeneration, the state of the storage cell is changed to a logical "0" with node A at near 0 volts and node B at above 1.3 volts.

If a "1" is to be written, the opposite bit line (bit line "1") is dropped 2 volts through device Q8. Bit lines are never dropped below about 2 volts, since unselected cells along a bit line must not be disturbed. If bit lines are maintained at a voltage high enough (2 volts) to keep the load devices Q1 and Q2 of the unselected cells in the pinch-off (saturated) region of operation, internal node voltages A and B will remain unaltered from the standby state, even during the write operation. The unselected storage cells along a word line remain undisturbed during a write operation, since the bit lines are relatively balanced and see the equivalent of a read operation, which will now be described.

Consider now the read operation. The read operation is accomplished by raising the selected word line (again assume word line 1) and the associated load gating node (D) of the selected cell to 8.5 volts, while keeping gating devices Q7 and Q8 "off". The load current in the "on" side of the selected cell increase and the additional voltage drop in common bit line load devices Q5 or Q6 (depending on whether storage cell state is "0" or "1") is A.C. coupled through coupling capacitors C1 or C2 and differentially sensed at nodes F and G. Typically, the common load devices Q5 and Q6 are designed to give an additional sense current drop of about 0.5 volts for a sense current of about 50 microamps (ua). The design must also insure that the bit lines are sufficiently balanced with full to no load current for a non-disturb read operation.

With continued reference to FIG. 3, refer back to FIG. 1 in which the load devices are assumed depletion load devices with threshold voltages of approximately 1.5 to 2 volts. The foregoing description of the operation of FIG. 2 is equally applicable except that the word line may be brought to a full 0 volts during standby as indicated by dotted lines in FIG. 3. This is a desirable aspect of using depletion load devices. It is noted that in some applications, bleeder currents may have to be provided from the bit line to ground, depending on time available to recover capacitors C1 and C2 when using a sense scheme at node F and G that couples positively into the unloaded bit line after the completion of a read operation.

What has then been described is a static memory cell requiring only four field effect transistors. Advantages are that insignificant capacitive coupling into the silicon substrate results, since during a read or write operation, the bit line transition is minor and unselected word lines are static. Transient power dissipation is reduced for the same reason. There is potentially less sensitivity of internal storage cell nodes to surface leakage, since the bit lines are not brought to 0 volts. There is also a greater tolerance to bit line leakage current when small sense signals are employed. Of course, as is the case with any static D.C. stable cell, no regeneration or refresh of any kind is required. Since only four devices are required, a small storage cell area is provided with a resultant higher packing density within a given size semiconductor substrate.

While the invention has been shown and particularly described with reference to preferred embodiments, it will be understood by those skilled in the art that various changes in form and detail may be made therein without departing from the spirit and scope of the invention.

What is claimed is:

1. A semiconductor memory array having a plurality of field effect transistor memory cells, comprising:
   first and second field effect transistors having two gated electrodes and a gating electrode, the first gated electrodes being connected together, the second gated electrode of the first field effect transistor being coupled to the gating electrode of the second field effect transistor, the second gated electrode of the second field effect transistor being coupled to the gating electrode of the first field effect transistor;
   a third field effect transistor having two gated electrodes and a gating electrode, a first gated electrode being connected to the second gated electrode of said first field effect transistor, the second gated electrode of said third field effect transistor being connected to a first bit line, the gating electrode of said third field effect transistor being connected to a word line;
   a fourth field effect transistor having two gated electrodes and a gating electrode, a first gated electrode being connected to the second gated electrode of said second field effect transistor, the second gated electrode of said fourth field effect transistor being connected to a second bit line, the gating electrode of said fourth field effect transistor being connected to said word line;
   said first and second field effect transistor being enhancement mode field effect transistors; and
   said third and fourth field effect transistors being depletion mode field effect transistors.

2. A semiconductor memory as in claim 1 additionally comprising:
   A.C. sensing means;
   a first capacitor coupling said first bit line to said sensing means; and
   a second capacitor coupling said second bit line to said sensing means.

3. A semiconductor memory as in claim 1 additionally comprising:
   a fifth field effect transistor having two gated electrodes and a gating electrode, the first gated electrode being connected to a first fixed source of potential, the second gated electrode being connected to said first bit line, the gating electrode being connected to a second fixed source of potential; and
   a sixth field effect transistor having two gated electrodes and a gating electrode, the first gated electrode being connected to said first fixed source of potential, the second gated electrode being connected to said second bit line, the gating electrode being connected to said second fixed source of potential.

4. A semiconductor memory array having a plurality of field effect transistor memory cells, comprising:
   first and second field effect transistors having two gated electrodes and a gating electrode, the first gated electrodes being connected together, the second gated electrode of the first field effect transistor being coupled to the gating electrode of the second field effect transistor, the second gated electrode of the second field effect transistor being coupled to the gating electrode of the first field effect transistor;
   a third field effect transistor having two gated electrodes and a gating electrode, a first gated electrode being connected to the second gated electrode of said first field effect transistor, the second gated electrode of said third field effect transistor being connected to a first bit line, the gating electrode of said third field effect transistor being connected to a word line;
   a fourth field effect transistor having two gated electrodes and a gating electrode, a first gated electrode being connected to the second gated electrode of said second field effect transistor, the second gated electrode of said fourth field effect transistor being connected to a second bit line, the gating electrode of said fourth field effect transistor being connected to said word line;
   said first and second field effect transistor being enhancement mode field effect transistors; and
   said third and fourth field effect transistors being enhancement mode field effect transistors;
   said bit lines being coupled to a first fixed source of potential;
   said first gated electrodes of said first field effect transistors being connected to a third fixed source of potential;
   said word line being coupled to one of two possible potential levels, neither one of said last mentioned potential levels turning off said third and fourth field effect transistors.

5. A semiconductor memory as in claim 4 additionally comprising:
A.C. sensing means;
a first capacitor coupling said first bit line to said sensing means; and
a second capacitor coupling said second bit line to said sensing means.

6. A semiconductor memory as in claim 4 additionally comprising:
a fifth field effect transistor having two gated electrodes and a gating electrode, the first gated electrode being connected to a first fixed source of potential, the second gated electrode being connected to said first bit line, the gating electrode being connected to a second fixed source of potential; and
a sixth field effect transistor having two gated electrodes and a gating electrode, the first gated electrode being connected to said first fixed source of potential, the second gated electrode being connected to said second bit line, the gating electrode being connected to said second fixed source of potential.

7. A method of operating a field effect transistor memory cell having only four devices, including two cross-coupled devices and two load devices, in a static mode, comprising the steps of:
selecting a desired cell by turning the two load devices fully-on;
non-selecting a desired cell by turning the two load devices partially-on; and
sensing a transient disturbance occasioned by the selected cell.

* * * * *